United States Patent [19]

Muller

[11] Patent Number: 5,176,744
[45] Date of Patent: Jan. 5, 1993

[54] SOLUTION FOR DIRECT COPPER WRITING

[75] Inventor: Heinrich G. O. Muller, Austin, Tex.

[73] Assignee: Microelectronics Computer & Technology Corp., Austin, Tex.

[21] Appl. No.: 742,795

[22] Filed: Aug. 9, 1991

[51] Int. Cl.⁵ ............................................. C09D 18/00
[52] U.S. Cl. ..................................................... 106/1.26
[58] Field of Search ............................. 106/1.18, 1.26

[56] References Cited

U.S. PATENT DOCUMENTS 3,119,713  1/1964  Hannahs ............................ 427/251
4,007,316  2/1977  Koontz ............................... 429/118

FOREIGN PATENT DOCUMENTS 368231    5/1990  European Pat. Off.
819148    1/1979  U.S.S.R.
730748    5/1980  U.S.S.R.
1129228  12/1984  U.S.S.R.
1171511   8/1985  U.S.S.R.
1513529  10/1989  U.S.S.R.

OTHER PUBLICATIONS

*MRS Proceedings* 101, 1988, Gupta and Jagannathan, pp. 95-100.
*Appl. Phys. Lett.* 51, 1987, Gupta and Jagannathan, pp. 2254-2256.
*Applied Surface Science* 43, Hoffman et al., pp. 54-60.
*Appl. Phys. Lett.* 56 (10), 1990, Muller, pp. 904-906.
*Applied Surface Science* (46), 1990, Muller, pp. 143-147.
*J. Mater Res.*, *1991*, Lin et al., vol. 6, No. 4, pp. 760-765.
*Appl. Phys.* B28, 1982, Gerassimov, p. 266.
Research Disclosure 26162, 1986.
Research Disclosure 29367, 1988.
Research Disclosure 2987, 1989.

Primary Examiner—Mark L. Bell
Assistant Examiner—Deborah Jones
Attorney, Agent, or Firm—Fulbright & Jaworski

[57] ABSTRACT

Improved method and solutions for copper direct writing, particularly laser-induced direct writing, involving copper formate precursor solutions that contain a crystallization-inhibiting agent. The agent is selected from glycerol, citric acid, malic acid, malonic acid and glycine.

6 Claims, 1 Drawing Sheet

SOLUTION FOR DIRECT COPPER WRITING

BACKGROUND OF THE INVENTION

The present invention relates to improved methods and solutions for direct copper writing and, particularly, to improved methods and solutions for direct writing of copper for chip modification or other fine structuring purposes.

Copper, because of its high conductivity and resistance to electromigration, is used extensively as an interconnect material in the electronics industry. Recent advances have shown that copper may be deposited advantageously by direct writing. Direct writing or metallization is a method of depositing thin conductive links or traces. A suitable metal-containing precursor, preferably a metalorganic precursor dissolved in solution, is dispensed onto a substrate. The substrate then is dried to remove excess solvent and to uniformly coat the substrate surface with a film having a thickness varying from the submicron to many micron range. The film then is either pyrolized thermally or decomposed photochemically using a laser in air, oxygen, nitrogen, or other suitable atmosphere to convert the metalorganic precursor to its constituent metal elements, oxides or other compounds.

The use of laser direct writing from metalorganic precursor films offers process simplicity and the potential of higher writing speeds compared to gas phase or solid metalorganic deposition techniques, since the ultimate rate of deposition is determined, in many cases, primarily by the kinetics of decomposition and not by mass transport as in gas and liquid phase deposition. High writing speed also can be achieved by using a liquid metalorganic precursor film which directly decomposes to the metal with few evolved volatiles and small activation energy.

The selection of precursors is important to successful direct writing processes. The precursors must meet certain requirements to be of practical use. These include (i) homogeneous film formation, (ii) good adhesion to common substrate materials, (iii) high solubility in a desired solvent or solvent mixture, (iv) high metal content, i.e., sufficient to form continuous metal features after complete decomposition of organic components, (v) low decomposition temperature, and (vi) high optical absorptivity to allow decomposition at a low laser power to prevent substrate damage during the laser writing process.

A preferred precursor recognized in the prior art is copper formate. Copper formate is known to thermally decompose to copper with the evolution of carbon dioxide and hydrogen in a non-oxidizing atmosphere. The fast heating and cooling of the decomposed copper during the writing process results in negligible oxidation after it is formed. In their articles, "Laser Writing of Copper Lines from Metalorganic Films," *Appl. Phys. Lett.* 51(26), 2254-56 (Dec. 28, 1987) and "Direct Writing of Copper Lines from Copper Formate Film," *MRS Proceedings* 101, 95-100 (1988), Gupta and Jagannathan describe laser direct writing of copper lines from copper formate films. Lin et al., "Effect of Surfactant on Casting Metalorganic Films and Writing Copper Metal Patterns," *J. Mater. Res.*, Vol. 6, No. 4, 760-65 April 1991), describe the inclusion of a wetting agent and emulsifier in copper formate solutions and the resulting improved results on direct writing. Additional disclosures regarding direct writing utilizing copper formate precursor solutions are found in Hoffmann, et al., "Fast Laser Writing of Copper and Iridium Lines from Thin Solid Surface Layers of Metalorganic Compounds," *Applied Surface Science* 43, 54-60 (1989) and Gerassimov et al., "Laser-Induced Decomposition of Organometallic Compounds," *App. Phys.* B28, 266 (1982).

The present inventor also has written on the advantages of laser direct writing of copper from copper formate films. In "Laser Direct Writing of Copper on Various Thin Film Substrate Materials," *Applied Surface Science* 46, 143-47 (1990), he discusses laser direct writing of copper from dried-on copper formate films on to $Al_2O_3$, AlN, polyimide and aluminum. Also, in "YAG Laser Direct Writing of Copper from Copper Formate Films," *Appl. Phys. Lett.* 56 (10), 904-06 (1990), he discusses depositing very thin copper lines by direct writing techniques using water soluble precursor films from copper formate.

The patent-related literature provides teachings regarding metallization and the use of certain solutions for improved electrical properties. The following references, which in many cases, do not teach copper formate direct writing per se are illustrative of related techniques and solutions. Soviet Union Inventor's Certificate No. 547,462 discloses an adhesive composition, useful for printing plates, electronic components, etc., which includes formic acid and copper salt. Soviet Union Inventor's Certificate No. 1,513,529 discloses a method for producing electroconductive composite materials comprising copper formate, sulphur and a styrene copolymer. European Patent Application No. 368,231 discloses a process for producing a copper-plated resin article utilizing a dry process. The process includes heating a copper formate film under reduced pressure or in a non-oxidizing atmosphere. Research Disclosure No. 29878 discloses a technique for repairing open circuits by applying a doped precursor comprising copper formate and a small amount of polydiacetylene or polythiophene. Soviet Union Inventor's Certificate No. 1,171,511 describes a lubricant for heavy duty machines, which comprises glycerol and a copper salt. Soviet Union Inventor's Certificate No. 1,129,228 discusses the use of copper formate in a lubricant composition. The copper formate purportedly improves the anticorrosion properties of the lubricant. Soviet Union Inventor's Certificate No. 819,148 discloses a light sensitive solution useful for activating dielectric surfaces prior to metallization. The solution comprises copper formate, di-sodium salt of anthraquinone-disulphonic acid, nickel sulfate, potassium bromide, glycerine, saccharose and water. Research Disclosure No. 29367 discloses the localized laser deposition of gold from solid salts. Research Disclosure No. 26162 discusses the accelerated gas phase laser deposition of noble metals. U.S. Pat. No. 3,119,713 discloses a method and apparatus for vapor plating copper from a copper containing composition. The preferred slurry comprises copper formate, formic acid and copper turnings. U.S. Pat. No. 4,007,316 discloses a deferred action battery having an improved depolarizer, which may include copper formate. Finally, Soviet Union Inventor's Certificate No. 730,748 discloses polymer compositions useful for making metallo-polymer articles having good electroconducting mechanical and antifriction characteristics. The composition comprises a phenol-formaldehyde resin or polyvinylfurfural binder, graphite, copper formate and a gas absorber.

The above-described copper formate solutions, and particularly those described in the preceding articles, suffer from a crystallization of the initially amorphous copper formate films upon drying. As the thickness of the applied films increases, the degree of crystallization also increases. This crystallization makes it difficult, if not impossible, to find a useful process window for the laser decomposition of the film due to the different optical absorption properties of the copper formate. This crystallization problem is particularly acute in instances where thicker films are applied to the substrate. Also, many of the currently available solutions do not allow for fine deposition treatment because their lateral resolution capabilities are limited.

SUMMARY OF THE INVENTION

It is therefore, an object of the present invention to provide an improved copper formate solution for direct copper writing.

Another object of the invention is to provide an improved copper formate solution that prevents crystallization of copper formate during drying.

A further object of the invention is to provide a solution that both prevents crystallization during drying and provides for the formation of relatively thick copper traces.

Yet another object of the invention is to provide a copper formate solution that results in improved lateral resolution of the deposition process.

Still another object is provision of an improved method for direct copper writing.

Additionally, an object of the present invention is the provision of an improved method for direct copper writing that allows for local application.

Thus, in accordance with one aspect of the present invention, there is provided a precursor solution for laser-induced copper writing comprising water, copper formate, and a crystallization-inhibiting compound selected from the group consisting of glycerol, citric acid, malic acid, malonic acid, glycine and combinations thereof. Preferably the crystallization-inhibiting compound is glycerol, and is present in an amount from about five to fifty percent by weight. Alternatively, the inhibiting compound is citric acid, malic acid, malonic acid, glycine or combinations thereof. Advantageously, the solution further comprises a surfactant.

In accordance with another aspect of the present invention, there is provided a laser-induced direct copper writing method, comprising the steps of depositing onto a substrate a film formed from a copper formate solution comprising water, copper formate and a crystallization-inhibiting compound selected from the group consisting of glycerol, citric acid, malic acid, malonic acid, glycine and combinations thereof, drying said deposited copper formate film, decomposing said copper formate film by exposure to a heat source to develop copper deposits, and removing the nondeveloped film. Preferably, the heat source is a laser, and more preferably, a frequency doubled Nd:YAG laser. It is particularly preferred to pulse the laser light.

The present solutions and methods provide copper formate films that do not crystallize during drying. Accordingly, the film can be exposed to laser power to produce uniform, conductive copper tracings and links. The process is reliable and repeatable. It also offers the possibility of local precursor film application. Particularly, the process is useful, not only for laser writing, but also laser repair and laser prototyping. Besides these advantages, the present inventions are extremely simple, do not require vacuum equipment, and do not require the use of toxic chemicals.

A particular advantage of the glycerol-containing solutions of the present invention is the ability to produce relatively thick copper lines with improved lateral resolution. The improved line thickness is a result of the glycerol-containing copper formate solution's honey-like, highly viscous liquid consistency. The solution seeps onto previously exposed areas, thus providing for additional exposure of the same area and a resulting increase in thickness. The improved lateral resolution capabilities of the invention result from the fact that the solution allows for the use of pulsed light rather than a continuous wave light.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

Copper deposits produced according to the present invention are illustrated by the photomicrographs of FIGS. 1 and 2.

DETAILED DESCRIPTION OF THE PREFERRED EMBODIMENTS

Figure 1:
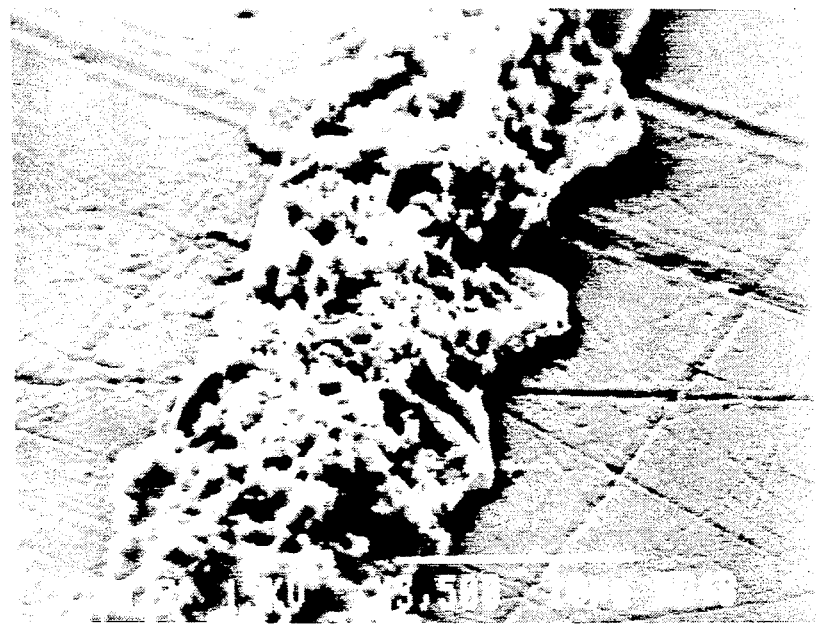
FIG. 1 is a photomicrograph of a copper tracing produced according to the present invention.

Many different metalorganic precursor solutions are possible according to the present invention. The basic solution includes an aqueous copper formate solution to which is added any number of crystallization-inhibiting compounds, alone or in combination. Particularly preferred is an aqueous solution of copper formate and glycerol. In addition, however, the inventor has recognized that aqueous copper formate solutions combined with citric acid, malic acid, malonic acid or glycine also provide advantageous results. Combinations of this latter group of compounds also have proved effective.

While the many advantages of the present invention will be discussed in more detail below, two significant advantages are the crystallization-inhibiting properties and the copper deposition capabilities of the solutions. It has been discovered that solutions containing at least about five percent by weight of additive sufficiently prevent crystallization of the copper formate during drying of the film. It has been discovered that acceptable decomposition of the copper formate is achieved from solutions containing up to about fifty percent of the corrosion-inhibiting additive. Solutions with additive contents greater than about fifty percent become increasingly impractical because the deposits need higher laser power for formation and become increasingly non-adherent. Accordingly, an additive content of between about five to fifty percent by weight is preferred. Especially preferred are solutions containing about ten to forty percent by weight of additive. The weight percentage of additive is relative to the dried film weight. The solutions can be prepared under ambient conditions by adding copper formate to a solution containing the additive in water.

The amounts of additive and copper formate in solution can be varied and depend upon the thickness of the copper writing desired. With respect to copper formate, a practical approach suggests that a saturated copper formate solution be used. This results in the maximum amount of copper formate being available per ml of any solution at room temperature. Of course, should smaller amounts be required, starting solutions that contain less than saturated amounts of copper formate may be prepared. As previously discussed, the amount of glycerol added to solution should result in a weight percentage of glycerol in the dried film of from about five to fifty percent, and preferably from about ten to forty percent.

As an example of useful solutions, much testing has been performed in which 78 cm$^2$ substrate surfaces have been coated. It has been found by this testing that about 2 ml of a saturated copper formate-water solution can be added to about 1 ml of a ten percent glycerol solution. When coated onto the substrate and dried, as will be discussed below, the resulting copper formate precursor films offer the advantageous properties of the present invention.

It is preferred to add a surfactant to the above solution. A variety of surfactants maybe used as long as the surfactant sufficiently reduces the surface tension of the copper formate solution to provide for a continuous copper formate coating when dried onto the substrate. The amount of surfactant added depends upon the surfactant chosen. In the solution described above, about 1 $\mu$l of the commonly available "Palmolive" dishwashing liquid was added to the solution.

The solutions, once prepared, are utilized to provide precursor films for laser-induced direct copper metallization. This is achieved first by introducing the solution to a substrate. For example, the solution may be dispensed onto and spread over the substrate to completely wet the substrate surface. Alternatively, the substrate may be submerged into a copper formate/water/additive solution at room temperature. The thickness of the applied film can vary, of course, depending upon desired end products. It has been discovered that, upon irradiation, the resulting copper deposition generally has a thickness of about ten to twenty percent of the bulk copper formate film. Accordingly, and by way of example. the solution described above, comprising 2 ml of saturated copper formate solution and 1 ml of ten percent glycerol solution, can be applied to a substrate of 78 cm$^2$ surface to provide a film having a 15 $\mu$m thickness after drying. Upon laser irradiation, the film produces a copper trace having a thickness of about 3 $\mu$m. Obviously, the thickness of the solution will vary based upon the desired end product and the composition of the solution.

The substrate can be selected from any number of available substrates, depending upon ultimate application of the copper coated product. For example, the substrate may be a polyimide coated wafer, which currently finds utility in the microelectronics area, various aluminum-based materials, such as aluminum oxide (Al$_2$O$_3$), aluminum nitride (AlN) and aluminum (Al), quartz or silicon. Other useful substrates are known to the skilled artisan.

Once applied to the substrate, the solution is dried. For example, the solution may be evaporated by introduction of a stream of hot air to produce a smooth, non-crystalline dried film. This film exhibits a macroscopically solid behavior; but, it shows liquid flow properties in the typical dimensions of laser deposits. If the film-coated substrate is not to be further processed immediately after drying, it should be placed in a non-humid environment until needed to prevent moisture absorption.

The dried film then is exposed to a heat source, preferably a laser. The laser decomposes the copper formate into its respective metallic and organic components. This laser-induced decomposition step, i.e., laser direct writing, can be performed under ambient conditions. The particular laser utilized according to the present invention is selected from commonly available lasers. Particularly preferred is a frequency doubled Nd:YAG laser; however, other lasers, for example, Ar$^+$, CO$_2$ and excimer lasers may be utilized. The determination of what laser power to use depends on the laser spot size, writing speed and the particular substrate. Laser powers from 15 mW to several watts are preferred in the present invention. As is known, it is possible to achieve locally high temperatures at lower laser power with a smaller laser spot. Also, as is known, higher laser powers can be used with aluminum oxide substrates compared to polyimide substrate.

The writing speed of the laser varies depending upon (1) the desired conductive properties of the copper, (2) whether the copper needs to be continuous, and (3) the laser power applied. Writing speeds less than 100 $\mu$m/s and up to at least about 1 mm/sec have proved useable. The skilled artisan can determine optimal speeds based upon these factors.

Taking all of the above variables into account, the present inventor has discovered that laser powers of between about 20-30 mW are effective with polyimide substrates and writing speeds of about 100 $\mu$m/s. In contrast, powers of about 2 W may be used on aluminum oxide substrates at writing speeds of about 5 cm/s.

The solution also provides for the use of pulsed light. This is possible because the viscous liquid consistency of the films allows for pulsed decomposition to copper without ablation of the precursor. Pulsed light does not heat the areas adjacent to the irradiation to the extent that continuous wave light does. Hence, the irradiation may be localized and the lateral resolution of the treatment may be significantly improved.

Because the dried films exhibit liquid flow properties, they have advantageous deposition properties. For example, because the dried films flow, multiple depositions may occur on the same line or spot. This results from the fact that, as the laser is applied along a predetermined line or spot, the surrounding film flows onto the exposed area, thus allowing further laser exposure and, hence, thicker copper deposits. The glycerol containing solutions particularly exhibit this property, whereas, the remaining solutions, e.g., citric acid, etc., tend to be drier.

Multiple scanning in this manner can easily produce wide interconnection lines and contact pads. Lines can be formed that have a height of at least 5 $\mu$m, and, in the case of a copper formate/glycerol solution, bumps up to 25 $\mu$m or more can be formed.

After illumination, the non-illuminated film is removed from the substrate. This can be done simply by dissolving the film in water or in a dilute acid solution, for example, in a 5 percent citric acid or 5 percent formic acid solution. This is sufficient to have copper only on the illuminated substrate areas.

Figure 2:
FIG. 2 is a photomicrograph of copper links produced according to the present invention. The links are extremely useful in laser repair and customization.

The copper lines resulting from the above-described solution and process are shown by the photomicrographs included as FIGS. 1 and 2.

FIG. 1 illustrates a copper line having a cross-section of about 10×5 $\mu$m$^2$ produced from a copper formate solution to which glycerol was added. As the photomicrograph illustrates, the deposit is very compact and of homogeneous cross section, thus providing very good electrical conduction.

FIG. 2 illustrates 10 μm gold features (produced by a conventional photolithographic process, including electroplating), interconnected at select points by contact links. The links are produced from a copper formate/glycerol solution according to the above-described process.

The present invention provides a solution and method for copper deposition that utilizes copper formate films as a cheap, non-toxic, high speed precursor. Not only does the invention result in good conducting copper deposits, but it also solves two previously existing problems in copper formate precursor copper deposition—crystallization of the precursor and limited lateral resolution of the deposition process. More particularly, in prior processes, the copper formate partially crystallizes, thus, preventing uniform laser induced deposition of copper from these films. The non-crystallized and crystallized forms of copper formate exhibit different optical absorption constants and require different laser power/speed parameters. Hence, uniform copper deposits cannot be produced. As a result of the present invention, such crystallization is eliminated.

Laser deposition of copper from amorphous copper formate films is known to be extremely easy from a practical viewpoint. For example, the process does not require vacuum equipment, does not create the health hazards of other processes that require toxic chemicals, is easily reproducible and has a stable precursor in copper formate. The present invention further advances the attractiveness of this process by providing a reliable precursor film deposition process and by making local application more possible. The latter property results also from the fact that the precursor does not crystallize, even if applied in very small spots. This fact greatly increases the utility of the invention for laser repair.

Another advantage offered by the present invention is a process that can produce thick copper lines without need for any vacuum processing. While thick films of copper formate (>5 μm) without crystallization inhibitor crystallize instantaneously on drying, the films with crystallization inhibitor can be made up to 25 μm thick, with the respective increase in thickness of the resulting copper deposits.

As previously mentioned, the present solution and process are applicable in a variety of situations. They find particular applicability in direct writing of copper interconnects for multi-chip modules. In addition, they can be used to personalize multi-chip modules with existing premetallization and for all kinds of repair processes on microelectronic devices with feature sizes down to 10 μm.

The present invention will be described in more detail by the following non-limiting examples.

EXAMPLES 1-13

Solutions comprising 2 ml of saturated copper formate/water solution and differing amounts of a ten percent by weight glycerol/water solution were prepared. The solutions were dispensed onto and spread over polyimide substrates and dried by passing hot air over the samples to produce films of about 15 μm thickness. The coated substrates then were placed in a dry box for 24 hours to prevent humidity accumulation by the film before laser irradiation.

The dried films were exposed to a frequency doubled Nd:YAG laser at Q-switch rates of 100 kHz and having a laser power of about 25 mw. The laser beam was focused to provide copper lines having widths of about 10 μm. The writing speed of the laser was about 100 μm/s.

The solutions utilized and the results achieved were as follows:

| Amount solution 10% Glycerol [ul] | Weight film [mg] | Weight Glycerol (= weight film minus weight of copper formate (154.7 mg)) | % glycerol of total film weight | crystallization in 6 days |
| --- | --- | --- | --- | --- |
| 0 | 146.8 | −7.9 | −5.4 | >95% |
| 25 | 156.6 | 1.9 | 1.2 | >95% |
| 50 | 158.4 | 3.7 | 2.3 | >90% |
| 75 | 168.0 | 13.3 | 7.9 | ca 30% |
| 100 | 171.3 | 16.6 | 9.7 | ca 50% |
| 200 | 179.9 | 25.2 | 14.0 | <1% |
| 300 | 194.2 | 39.5 | 20.3 | negligible |
| 400 | 198.9 | 44.2 | 22.2 | negligible |
| 600 | 223.9 | 69.2 | 30.9 | negligible |
| 800 | 232.7 | 78.0 | 33.5 | negligible |
| 1000 | 235.7 | 81.0 | 34.4 | negligible |
| 1500 | 309.4 | 154.7 | 50.0 | negligible |
| 2000 | 378.6 | 232.9 | 61.5 | negligible |

The exact composition of the copper formate-water-glycerol system for very low glycerol contents is difficult to measure, because complicated replacements of crystal water by glycerol (which itself is water absorbent) take place. For the actual working parameters, this is of minor importance, but it makes the glycerol free film come out with a formally negative glycerol content. This could be interpreted as an increase of the film's ability to bind water, when glycerol is also present. Also, for films thinner than the ones here investigated, the critical percentage of glycerol for crystallization prevention is lower. Earlier experiments have been performed with thinner formate films of approximately 5 μm thickness; some of these films exhibited non-crystallization for several hours without use of crystallization inhibitors.

Direct write copper lines having thicknesses of several micrometers were produced. The lines had a conductivity, compared to bulk copper, of about ten to twenty percent, and showed good adhesive properties.

EXAMPLE 14

A copper formate/citric acid solution was prepared by combining 3 ml of a saturated copper formate/water solution with 1 ml of a two percent by weight solution of citric acid and water. The solution was applied to a polyimide substrate and exposed to a Nd:YAG laser in the manner described above to produce copper lines having a cross-section of about 20 μm in width 5 μm in height. These copper lines were of comparable quality to the ones mentioned in the examples above.

EXAMPLE 15

Saturated copper formate solutions were formed. The following amounts of crystallization-inhibiting agents were prepared: 5 g malic acid/30 ml H₂O (Example 15), 5 g malonic acid/30 ml H₂O (Example 16), and 5 g glycine/30 ml H₂O (Example 17). In each instance, 200 microliters of the crystallization-inhibiting solution were added to 3 ml formate solution.

The solutions were applied to the substrate, dried, decomposed and rinsed in the manner described above to produce copper lines that exhibited good conduction. In all the examples 15-17, the absence of copper formate crystallization during and after film drying was evident.

The present invention, therefore, is well-adapted to carry out the objects and attain the ends and advantages mentioned as well as others inherent therein. While presently preferred embodiments of the invention have been given for the purpose of disclosure, numerous changes in the details of construction, arrangement of parts, and steps of the process, may be made which will readily suggest themselves to those skilled in the art and which are encompassed within the spirit of the invention and the scope of the appended claims.

What is claimed is:

1. A precursor solution for laser-induced copper writing consisting essentially of:
   water;
   copper formate; and
   at least 5% by weight of a crystallization-inhibiting compound selected from the group consisting of glycerol, citric acid, malic acid, malonic acid, glycine or combinations thereof.

2. A precursor solution as claimed in claim 1, wherein said crystallization-inhibiting compound is glycerol.

3. A precursor solution as claimed in claim 1, wherein said crystallization-inhibiting compound is present in an amount from about five to fifty percent by weight of the non-volatile components.

4. A precursor solution as claimed in claim 1, where said crystallization-inhibiting compound is present in an amount from about 10 to 40 percent by weight of the non-volatile components.

5. A precursor solution as claimed in claim 1, further comprising a surfactant in an amount effective to reduce the surface tension of the precursor solution.

6. A precursor solution as claimed in claim 1, wherein said crystallization-inhibiting compound is citric acid, malic acid, malonic acid, glycine or combinations thereof.

* * * * *

UNITED STATES PATENT AND TRADEMARK OFFICE
CERTIFICATE OF CORRECTION

PATENT NO. : 5,176,744
DATED : January 5, 1993
INVENTOR(S) : Heinrich G. O. Muller It is certified that error appears in the above-indentified patent and that said Letters Patent is hereby corrected as shown below:

Column 1, line 3, insert the following:

--The U.S. Government has a paid-up license in this invention and the right in limited circumstances to require the patent owner to license others on reasonable terms as provided for by the terms of contract No. J-FBI-89-103 awarded by the Defense Advanced Research Projects Agency (DARPA).--

Signed and Sealed this

Eighteenth Day of October, 1994

*Attest:*

BRUCE LEHMAN

*Attesting Officer*  *Commissioner of Patents and Trademarks*